(12) United States Patent
Miyauchi et al.

(10) Patent No.: US 6,283,273 B1
(45) Date of Patent: Sep. 4, 2001

(54) SUBSTRATE PROCESSING APPARATUS

(75) Inventors: Akihiro Miyauchi, Hitachi; Yohsuke Inoue, Ibaraki; Takaya Suzuki, Hitachinaka, all of (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/456,457

(22) Filed: Dec. 8, 1999

(30) Foreign Application Priority Data

Dec. 8, 1998 (JP) .................................................. 10-348221

(51) Int. Cl.[7] .................................................. B65G 47/34
(52) U.S. Cl. .................................. 198/468.8; 414/749.1; 414/941
(58) Field of Search ............................. 198/468.6, 468.8, 198/482.1; 414/416.09, 416.11, 749.1, 939, 941, 222.07

(56) References Cited

U.S. PATENT DOCUMENTS 5,421,893   6/1995   Perlov .
5,636,963 * 6/1997   Haraguchi et al. .................. 414/939

* cited by examiner

Primary Examiner—Joseph E. Valenza
(74) Attorney, Agent, or Firm—Hogan & Hartson L.L.P.

(57) ABSTRACT

A substrate processing apparatus comprises a substrate processing chamber, a transfer chamber, a substrate mounting body having a through hole formed in a vertical direction and being provided in the substrate processing chamber, a substrate lifting member capable of vertically moving in the through hole, a first arm, capable of extending from the transfer chamber into the substrate processing chamber, for transferring the substrate in a horizontal direction, a second arm capable of extending from the transfer chamber into the substrate processing chamber, capable of moving in a vertical direction and separating the substrate upward from the substrate mounting body by moving the substrate lifting member upward, and a driving mechanism provided in the transfer chamber for extending the first and second arms from the transfer chamber into the substrate processing chamber and for moving the first arm in the horizontal direction and moving the second arm in the vertical direction.

16 Claims, 5 Drawing Sheets

SUBSTRATE PROCESSING APPARATUS

BACKGROUND OF THE INVENTION

1. Field of the Invention

The present invention relates to a substrate processing apparatus, and more particularly, to a semiconductor manufacturing apparatus for processing and manufacturing a semiconductor wafer.

2. Description of the Related Art

Prior art for placing and taking out a wafer on and from a susceptor in a reaction chamber having the susceptor therein will be described below.

FIG. 10 is a schematic sectional view of a reaction chamber 900 described in Japanese Patent Application Laid-open No. H6-318630. A wafer 902 is processed in a reaction chamber 901 in a state where the wafer 902 is placed on a susceptor 903. The wafer 902 rotates together with the susceptor 903 and a susceptor supporting cradle 905.

Next, a taking out operation of the wafer 902 will be explained. A hollow driving shaft 904 moves downward in a state where the susceptor 903 stops rotating, and with this downward motion, the susceptor supporting cradle 905, the susceptor 903, the wafer 902 and wafer supporting pins 906 also move downward. Among their downward movements, the downward movement of the wafer supporting pins 906 is stopped by an arm 907 during its downward motion.

Since the wafer supporting pins 906 are located in through holes 913 in the susceptor 903, the hollow driving shaft 904 further moves downward, and the susceptor supporting cradle 905 and the susceptor 903 keep moving downward even after the downward movement of the wafer supporting pins 906 is stopped.

As a result, the wafer 902 is separated from the susceptor 903 by the wafer supporting pins 906. Then, a wafer transfer arm 911 is inserted between the wafers 902 and the susceptor 903 from an access port 910. Next, a wafer supporting cradle 909 comprising the arm 907 and a hollow shaft 908 moves downward together with the susceptor supporting cradle 905, and the wafer 902 is placed on the wafer transfer arm 911.

By pulling the wafer transfer arm 911 from the reaction chamber 901, the wafer 902 can be taken out from the reaction chamber 901. Since the wafer 902 can be transferred into the reaction chamber 901 by reversing the taking out procedure, its explanation will be omitted here.

According to this prior art, the wafer supporting pins 906 are brought into contact with the arm 907 by moving the susceptor supporting cradle 905 downward, thereby separating the wafer 902 from the susceptor 903. Then, after the wafer transfer arm 911 is inserted between the wafer 902 and the susceptor 903, moving means for moving both the susceptor supporting cradle 905 and the wafer supporting cradle 909 downward is required.

Further, in order to enhance the uniformity in thickness of a thin film formed onto the wafer, the prior art also includes rotating means for rotating the susceptor 903. Therefore, complicated vertically moving/rotating means 912 comprising means for vertically moving the two cradles 905 and 909 and rotating means for the susceptor 903 which are coaxially incorporated is required at a lower portion of the reaction chamber.

Further, in order to decompress the reaction chamber, it is necessary to dispose a plurality of O-rings for vacuum sealing in the vertically moving/rotating means 912. Therefore, the above-described prior art has a problem that the vertically moving/rotating means 912 having extremely complicated structure is required.

Further, Japanese Patent Application Laid-open No. H8-97274 discloses a wafer thermal treating apparatus comprising first and second transfer means in its reaction chamber. However, when such transfer means are provided in the reaction chamber, dust and the like can not be prevented from being generated from mechanically sliding portions, and it is not preferable because this can be a factor of contamination of a semiconductor wafer.

SUMMARY OF THE INVENTION

It is a main object of the present invention to solve the problems of the prior art, and to provide a substrate processing apparatus, such as a semiconductor manufacturing apparatus, capable of transferring a substrate, such as a semiconductor wafer, into and out from a substrate processing chamber, such as a reaction chamber, having a substrate mounting body, such as a susceptor, without being provided with a transferring means having a complicated mechanism at a lower portion of a substrate processing chamber, such as a reaction chamber.

According to a first aspect of the present invention, there is provided a substrate processing apparatus, comprising:
  a substrate processing chamber for processing a substrate;
  a transfer chamber;
  a substrate mounting body for mounting the substrate, the substrate mounting body having a through hole formed in a vertical direction and being provided in the substrate processing chamber;
  a substrate lifting member capable of vertically moving in the through hole;
  a first arm, capable of extending from the transfer chamber into the substrate processing chamber, for transferring the substrate in a horizontal direction;
  a second arm capable of extending from the transfer chamber into the substrate processing chamber, capable of moving in a vertical direction, and capable of separating the substrate upward from the substrate mounting body by moving the substrate lifting member upward; and
  a driving mechanism provided in the transfer chamber for extending the first and second arms from the transfer chamber into the substrate processing chamber and for moving the first arm in the horizontal direction and moving the second arm in the vertical direction.

According to a second aspect of the present invention, there is provided a substrate processing apparatus, comprising:
  a substrate processing chamber for processing a substrate;
  a transfer chamber;
  a substrate mounting body for mounting the substrate, the substrate mounting body having a through hole formed in a vertical direction and being provided in the substrate processing chamber;
  a substrate lifting member capable of vertically moving in the through hole;
  a first arm, capable of extending from outside the substrate processing chamber into the substrate processing chamber, for transferring the substrate in a horizontal direction;
  a second arm capable of extending from outside the substrate processing chamber into the substrate processing chamber, capable of moving in a vertical direction, and capable of separating the substrate upward from the substrate mounting body by moving the substrate lifting member upward; and a driving mechanism provided outside the substrate processing chamber for extending the first and second arms from outside the substrate processing chamber into the substrate processing chamber and for moving the first arm in the horizontal direction and moving the second arm in the vertical direction.

According to a third aspect of the present invention, there is provided a substrate processing method using a substrate processing apparatus, comprising:

a substrate processing chamber for processing a substrate;

a transfer chamber;

a substrate mounting body for mounting the substrate, the substrate mounting body having a through hole formed in a vertical direction and being provided in the substrate processing chamber;

a substrate lifting member capable of vertically moving in the through hole;

a first arm, capable of extending from the transfer chamber into the substrate processing chamber, for transferring the substrate in a horizontal direction;

a second arm capable of extending from the transfer chamber into the substrate processing chamber, capable of moving in a vertical direction, and capable of separating the substrate upward from the substrate mounting body by moving the substrate lifting member upward; and a driving mechanism provided in the transfer chamber for extending the first and second arms from the transfer chamber into the substrate processing chamber and for moving the first arm in the horizontal direction and moving the second arm in the vertical direction, comprising the steps of:

loading the substrate onto the first arm and positioning the substrate above the substrate mounting body in the substrate processing chamber;

thereafter moving the substrate lifting member upward by moving the second arm upward, thereby moving the substrate from the first arm onto the substrate lifting member;

thereafter removing the first arm from below the substrate;

thereafter moving the substrate lifting member downward by moving the second arm downward, thereby moving the substrate from the substrate lifting member onto the substrate mounting body; and thereafter processing the substrate in the substrate processing chamber.

According to a fourth aspect of the present invention, there is provided a manufacturing method for a semiconductor device using an apparatus, comprising:

a semiconductor wafer processing chamber for processing a semiconductor wafer;

a transfer chamber;

a semiconductor wafer mounting body for mounting the semiconductor wafer, the semiconductor wafer mounting body having a through hole formed in a vertical direction and being provided in the semiconductor wafer processing chamber;

a semiconductor wafer lifting member capable of vertically moving in the through hole;

a first arm, capable of extending from the transfer chamber into the semiconductor wafer processing chamber, for transferring the semiconductor wafer in a horizontal direction;

a second arm capable of extending from the transfer chamber into the semiconductor wafer processing chamber, capable of moving in a vertical direction, and capable of separating the semiconductor wafer upward from the semiconductor wafer mounting body by moving the semiconductor wafer lifting member upward; and a driving mechanism provided in the transfer chamber for extending the first and second arms from the transfer chamber into the semiconductor wafer processing chamber and for moving the first arm in the horizontal direction and moving the second arm in the vertical direction, comprising the steps of:

loading the semiconductor wafer onto the first arm and positioning the semiconductor wafer above the semiconductor wafer mounting body in the semiconductor wafer processing chamber;

thereafter moving the semiconductor wafer lifting member upward by moving the second arm upward, thereby moving the semiconductor wafer from the first arm onto the semiconductor wafer lifting member;

thereafter removing the first arm from below the semiconductor wafer;

thereafter moving the semiconductor wafer lifting member downward by moving the second arm downward, thereby moving the semiconductor wafer from the semiconductor wafer lifting member onto the semiconductor wafer mounting body; and thereafter processing the semiconductor wafer in the semiconductor wafer processing chamber.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Embodiments of the present invention will be explained concretely with reference to the drawings.

(First Embodiment)

Figure 1:
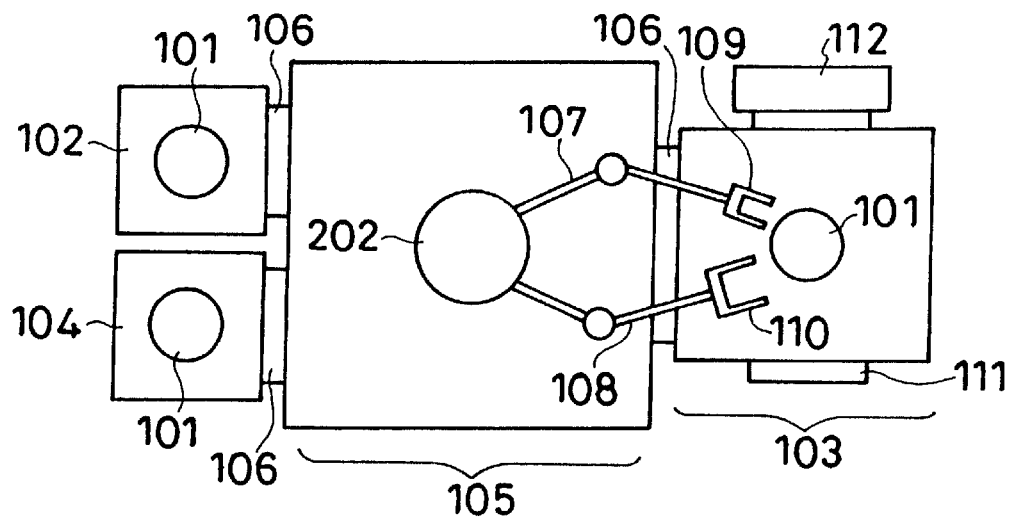
FIG. 1 is a schematic transversal sectional view for explaining a semiconductor manufacturing apparatus according to a first embodiment of the present invention.

Referring to FIG. 1, a semiconductor manufacturing apparatus of the present embodiment comprises a load chamber 102 for loading a silicon wafer 101 having a diameter of 200 mm, a reaction chamber 103, an unload chamber 104 for keeping therein the silicon wafer 101 which was processed in the reaction chamber 103, and a transfer chamber 105. The load chamber 102, the unload chamber 104 and the reaction chamber 103 are connected to the transfer chamber 105 through gate valves 106, 106 and 106.

A wafer transfer arm 107 for moving the silicon wafer 101 and a pin lifting arm 108 are disposed in the transfer chamber 105. The wafer transfer arm 107 and the pin lifting arm 108 can be controlled independently by an arm driving mechanism 202. The wafer transfer arm 107 and the pin lifting arm 108 are respectively provided at their tip ends with forks 109 and 110 made of quartz.

The reaction chamber 103 is provided with gas supplying equipment 111 for forming a polycrystalline silicon thin film or an epitaxial silicon thin film onto the silicon wafer 101, and gas discharge equipment 112. Gas supplied from the gas supplying equipment 111 is nitrogen gas, argon gas, monosilane or the like.

Although it is not illustrated, a gas flow rate controlling unit is disposed in each of the gas supplying lines. Further, a dry pump (not shown) is disposed in the discharge equipment 112, and the polycrystalline silicon thin film or the epitaxial silicon thin film can be formed under a reduced pressure.

Figure 2:
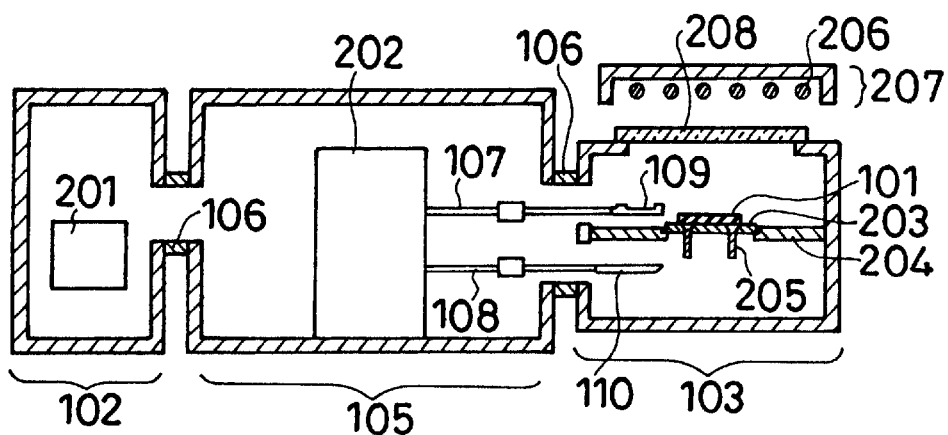
FIG. 2 is a schematic longitudinal sectional view of FIG. 1.

FIG. 2 is a vertical sectional view of FIG. 1. A wafer cassette 201 capable of loading a plurality of silicon wafers 101 is disposed in the load chamber 102, and the wafer cassette 201 can automatically move in the vertical direction. Although it is not illustrated, the same wafer cassette 201 is also disposed in the unload chamber 104.

An arm driving mechanism 202 for driving the wafer transfer arm 107 and the pin lifting arm 108 is disposed in the transfer chamber 105. The arm driving mechanism 202 controls expanding and contracting motions and vertical motions of the wafer transfer arm 107 and the pin lifting arm 108. Especially, in order to suppress vibration generated when the pin lifting arm 108 moves in the vertical direction, a hydraulic mechanism was employed as a vertically moving mechanism.

In the reaction chamber 103, a susceptor 203 for mounting the silicon wafer 101 thereon is placed on a susceptor holding plate 204. The susceptor 203 is made of graphite coated with silicon carbide thin film in thickness of about 60 $\mu$m. The susceptor 203 includes three pushing-up pins 205 used for separating the silicon wafer 101 from the susceptor 203.

Figure 3:
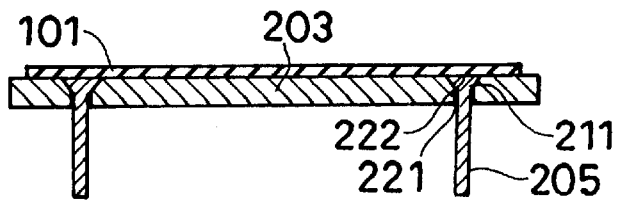
FIG. 3 is a schematic enlarged fragmentary longitudinal sectional view, showing a susceptor used in the semiconductor manufacturing apparatus according to the first embodiment of the present invention.

FIG. 3 is a schematic partially enlarged vertical sectional view of the susceptor 203. The susceptor 203 is provided with a through hole 221. Each of the pushing-up pins 205 is inserted through the through hole 221 such that the pushing-up pin 205 can move in the vertical direction. The through hole 221 is provided at its upper portion with a tapered portion 222. The pushing-up pin 205 is provided at its upper portion with a head 211, and the head 211 is accommodated in the tapered portion 222 so that the pushing-up pin 205 should not slip out from the susceptor 203.

The reaction chamber 103 is provided at its upper portion with a lamp unit 207 having 16 heating lamps 206 so that the interior of the reaction chamber 103 can be uniformly heated through a quartz glass plate 208. Gas introduced from the gas supplying equipment 111 mainly flows through the upper portion of the reaction chamber 103 which is divided by the susceptor holding plate 204 and the susceptor 203, and the gas is discharged by the gas discharge equipment 112.

Next, a procedure for thermally processing the silicon wafer 101 actually will be explained.

The wafer cassette 201 loading 25 cleaned silicon wafers 101 was disposed in the load chamber 102.

The fork 109 of the wafer transfer arm 107 was inserted into a predetermined location between the loaded silicon wafers 101 by rotation of the arm driving mechanism 202, and only one silicon wafer 101 was placed on the fork 109 by displacing the wafer cassette 201 downward by 3 mm.

Next, the wafer transfer arm 107 was rotated by rotation of the arm driving mechanism 202, and moved into the reaction chamber 103. After the silicon wafer 101 on the fork 109 was moved directly above the susceptor 203, the pin lifting arm 108 was inserted under the susceptor 203 and displaced upward by 10 mm, and the fork 110 pushed up the pushing-up pins 205, thereby separating the silicon wafer 101 from the fork 109 and placing the silicon wafer 101 on the pushing-up pins 205.

Next, after the wafer transfer arm 107 was returned into the transfer chamber 105, the pin lifting arm 108 was displaced downward, and the silicon wafer 101 was placed on the susceptor 203. Then, the pin lifting arm 108 was returned into the transfer chamber 105, and the transferring procedure of the silicon wafer 101 was completed.

Next, the gate valves 106 separating the reaction chamber 103 and the transfer chamber 105 from each other were closed and then, argon gas was allowed to flow from the gas supplying equipment 111 at five liters/minute and at the same time, the dry pump (not shown) of the gas discharge equipment 112 was operated to lower a pressure in the reaction chamber 103.

When the pressure reached one Torr, the heating lamps 206 illuminated, and the silicon wafer 101 on the susceptor 203 was heated to 800° C. The heating lamps 206 went out after 15 seconds from the instant when the wafer was heated to 800° C., immediately thereafter nitrogen gas was introduced into the reaction chamber 103 from the gas supplying equipment 111 and after 30 seconds, the pressure in the reaction chamber 103 was returned to the atmospheric pressure.

Next, the pin lifting arm 108 was inserted under the susceptor 203 and displaced upward by 10 mm, the fork 110 pushed up the pushing-up pins 205, thereby separating the silicon wafer 101 from the susceptor 203 and placing the silicon wafer 101 on the pushing-up pins 205.

Then, the wafer transfer arm 107 was inserted into a gap between the susceptor 203 and the separated silicon wafer 101, the pin lifting arm 108 was displaced downward, and the silicon wafer 101 was placed on the fork 109. The pin lifting arm 108 was returned into the transfer chamber 105, the wafer transfer arm 107 was rotated and moved into the unload chamber 104 from the reaction chamber 103, and the wafer 101 was moved to the wafer cassette 201.

The silicon wafer 101 on the fork 109 was separated from the fork 109 by displacing the wafer cassette 201 upward by 3 mm, and the silicon wafer 101 was loaded onto the wafer cassette 201. By returning the wafer transfer arm 107 into the transfer chamber 105, a series of heating process was completed.

Further, by making it possible to rotate the susceptor 203, it is possible to uniform a temperature distribution within the surface of the silicon wafer 101. Furthermore, not only the thermal processing, but also when a thin film is to be formed, it is possible to uniform a film thickness of the thin film to be formed on the silicon wafer 101.

(Second Embodiment)

Figure 4:
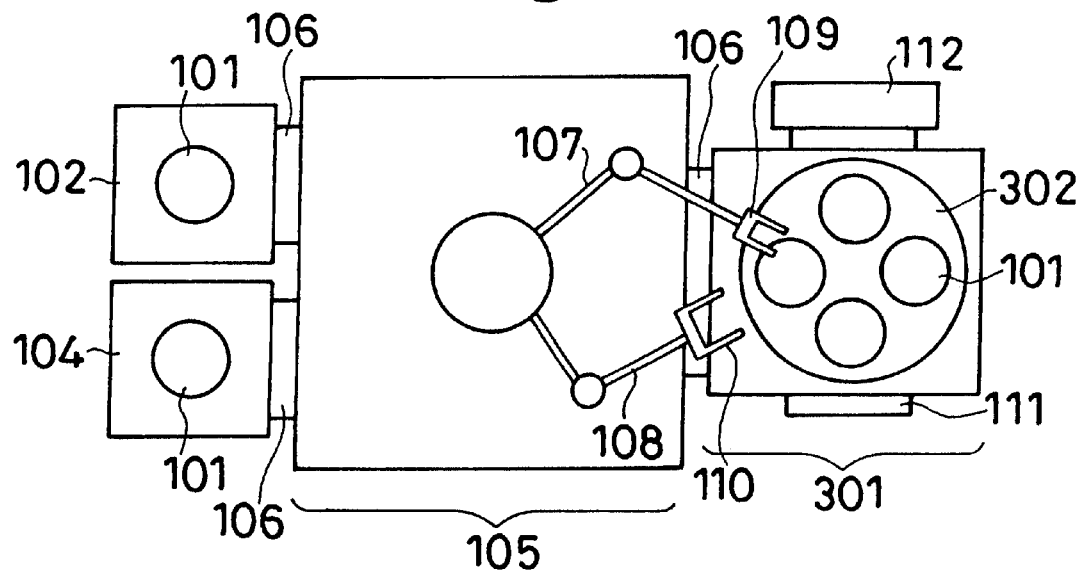
FIG. 4 is a schematic transversal sectional view for explaining a semiconductor manufacturing apparatus according to a second embodiment of the present invention.

FIG. 4 is a schematic transverse sectional view of an apparatus of the second embodiment capable of simultaneously processing four silicon wafers 101. Since the second embodiment is the same as the first embodiment except a reaction chamber 301, only the reaction chamber 301 will be explained here.

A susceptor 302 capable of mounting four silicon wafers 101 at a time is provided in the reaction chamber 301. The susceptor 302 is made of graphite coated with a silicon carbide thin film in thickness of about 60 $\mu$m, dents (not shown) of 210 mm diameter×400 $\mu$m depth are formed on a surface of the susceptor 302, and the silicon wafers 101 are disposed in the dents.

Figure 5:
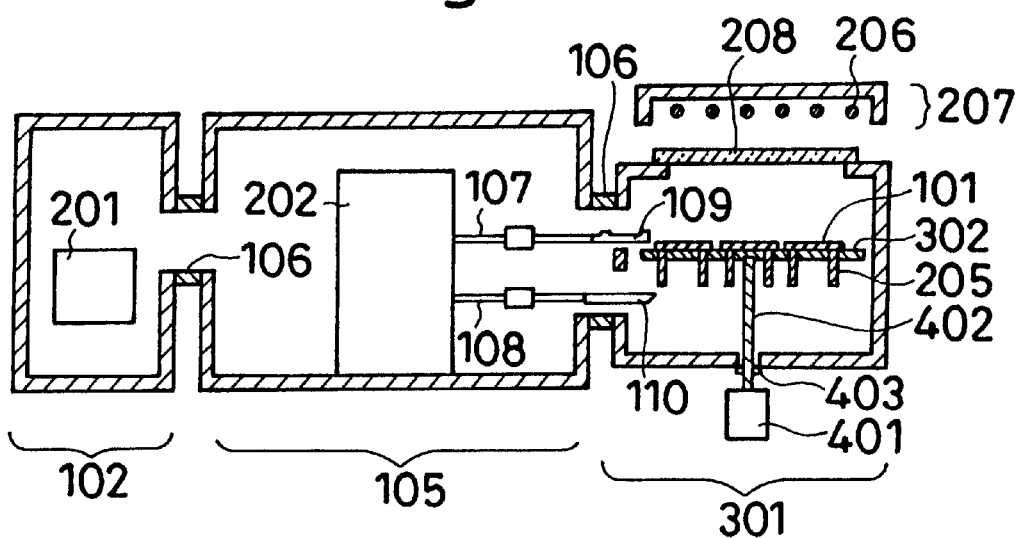
FIG. 5 is a schematic longitudinal sectional view of FIG. 4.

FIG. 5 is a vertical sectional view of FIG. 4, and shows the same structure as that of the first embodiment except for the reaction chamber 301. A rotation mechanism 401 of the susceptor 302 is provided at a lower portion of the reaction chamber 301, and the susceptor 302 can be rotated by a rotation shaft 402. A vacuum seal 403 is provided for cutting off the reaction chamber 301 from outside air.

The susceptor 302 comprises 12 pushing-up pins 205 in total for moving the silicon wafers 101, and three pushing-up pins 205 act for one silicon wafer each. Structures of the susceptor 302 and the pushing-up pins 205 are the same as those of the susceptor 203 and the pushing-up pins 205 explained above with reference to FIG. 3.

The wafer cassette 201 loading 25 cleaned silicon wafers 101 was disposed in the load chamber 102. The fork 109 of the wafer transfer arm 107 was inserted into a predetermined location between the loaded silicon wafers 101, and only one silicon wafer 101 was placed on the fork 109 by displacing the wafer cassette 201 downward by 3 mm.

Next, the wafer transfer arm 107 was moved into the reaction chamber 301. After a silicon wafer 101 on the fork 109 was moved above one of the four dents (not shown) of the susceptor 302 that was closest to the transfer chamber 105, the pin lifting arm 108 was inserted under the three pushing-up pins 205 disposed in the dent that was the closest to the transfer chamber 105. The pin lifting arm 108 was displaced upward by 10 mm, and the fork 110 pushed up the pushing-up pins 205, thereby separating the silicon wafer 101 from the fork 109 and placing the silicon wafer 101 on the pushing-up pins 205.

Next, the wafer transfer arm 107 was returned into the transfer chamber 105 and then inserted into the load chamber 102, and a new silicon wafer 101 was taken out from the load chamber 102 in the same manner as that of the first silicon wafer 101. While the wafer transfer arm 107 was taking out the new silicon wafer 101 from the load chamber 102, the pin lifting arm 108 was displaced downward, and the silicon wafer 101 was placed in the dent of the susceptor 302. Then, the susceptor 302 was rotated by 90 degrees by rotation means 401.

Then, a new silicon wafer 101 was moved from the transfer chamber 105 onto one of the four dents of the susceptor 302 that was closest to the transfer chamber 105 after the above-described rotation. Then, the pin lifing arm 108 was again displaced upward by 10 mm, the fork 110 pushed up the pushing-up pins 205, thereby separating the new silicon wafer 101 from the fork 109 and placing the silicon wafer 101 on the pushing-up pins 205.

Thereafter, the four silicon wafers 101 were sequentially placed on the susceptor 302 in the same manner. After the fourth silicon wafers 101 were placed on the susceptor 302, the wafer transfer arm 107 and the pin lifting arm 108 were returned into the transfer chamber 105, and the transferring procedure of the four silicon wafers 101 was completed.

Next, the gate valves 106 separating the reaction chamber 103 and the transfer chamber 105 from each other were closed and then, argon gas was allowed to flow from the gas supplying equipment 111 at five liters/minute and at the same time, the dry pump (not shown) of the gas discharge equipment 112 was operated to lower a pressure in the reaction chamber 301.

When the pressure reached one Torr, the heating lamps 206 illuminated, and the silicon wafer 101 on the susceptor 302 was heated to 800° C. The heating lamps 206 went out after 15 seconds from the instant when the wafer was heated to 800° C., immediately thereafter nitrogen gas was introduced into the reaction chamber 301 from the gas supplying equipment 111 and after 30 seconds, the pressure in the reaction chamber 301 was returned to the atmospheric pressure.

Next, the pin lifting arm 108 was moved under the silicon wafer 101 that was closest to the transfer chamber 105 and displaced upward by 10 mm, and the fork 110 pushed up the pushing-up pins 205, thereby separating the silicon wafer 101 from the susceptor 302 and placing the silicon wafer 101 on the pushing-up pins 205.

Then, the wafer transfer arm 107 was inserted into a gap between the susceptor 302 and the separated silicon wafer 101, the pin lifting arm 108 was displaced downward, and the silicon wafer 101 was placed on the fork 109. The wafer transfer arm 107 was moved to the wafer cassette 201 in the unload chamber 104 from the reaction chamber 301, the silicon wafer 101 on the fork 109 was separated from the fork 109 by displacing the wafer cassette 201 upward by 3 mm, and the silicon wafer 101 on the fork 109 was loaded onto the wafer cassette 201.

While the wafer transfer arm 107 moved the processed silicon wafer 101 to the unload chamber 104, the susceptor 302 was rotated by 90 degrees by the rotation mechanism 401 and then, the pin lifting arm 108 was displaced upward by 10 mm, the second silicon wafer 101 was separated from the susceptor 302 by the fork 110 and placed on the pins 205. Then, the wafer transfer arm 107 was inserted between the susceptor 302 and the silicon wafer 101 which was pushed up by the pushing-up pins 205.

Thereafter, the remaining silicon wafers 101 were moved into the unload chamber 104 in the same manner as that when the first silicon wafer 101 was taken out, and a series of heating procedure was completed.

(Third Embodiment)

Figure 6:
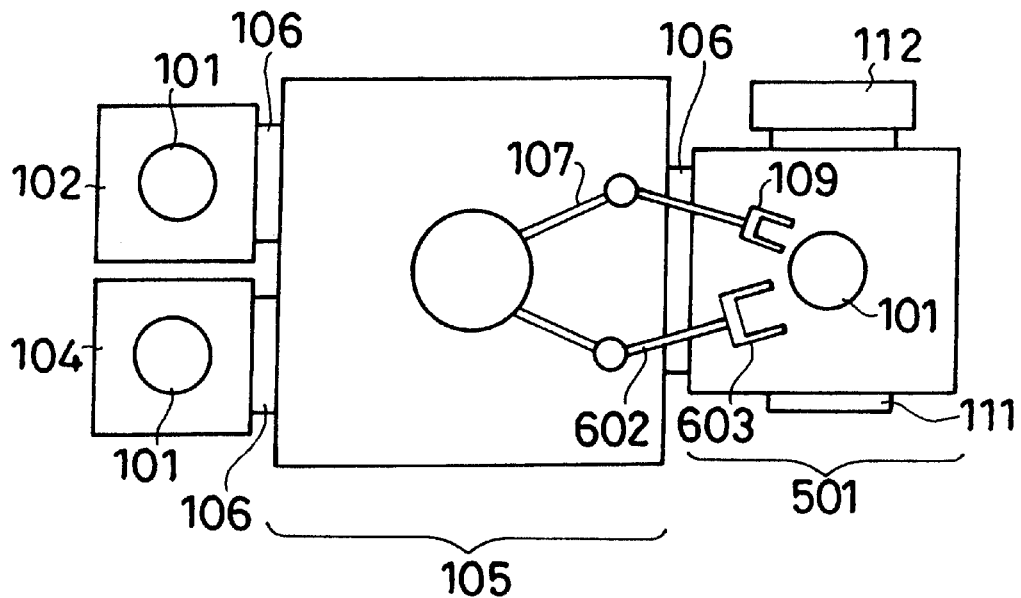
FIG. 6 is a schematic transversal sectional view for explaining a semiconductor manufacturing apparatus according to a third embodiment of the present invention.
Figure 7:
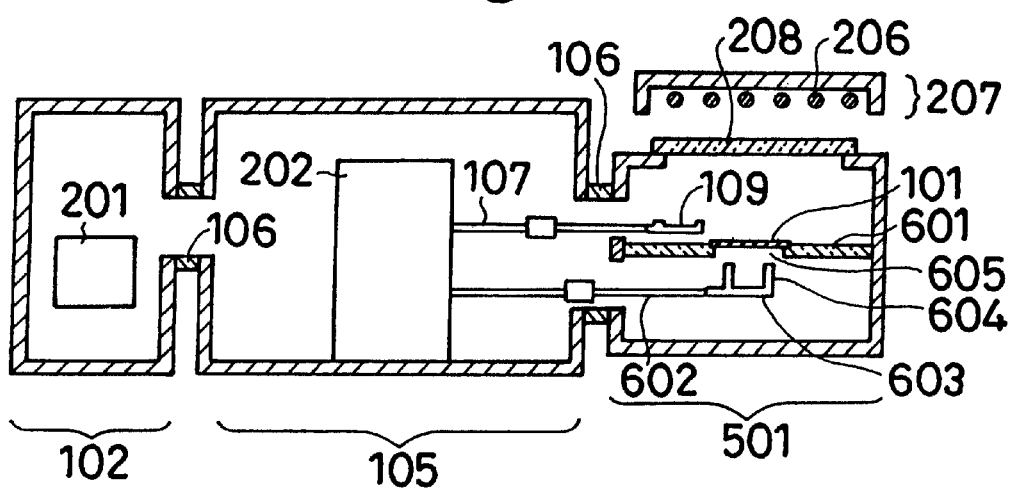
FIG. 7 is a schematic longitudinal sectional view of FIG. 6.

FIGS. 6 and 7 are respectively schematic transverse sectional view and schematic longitudinal sectional view of an apparatus of the third embodiment. Since the third embodiment is the same as the first embodiment except for the reaction chamber 501 and the fork 603 of the wafer lifting arm 602.

A susceptor 601 on which the silicon wafer 101 is to be placed is disposed in the reaction chamber 501. The susceptor 601 is made of quartz and provided at its center with a circular opening 605. The wafer lifting arm 602 is provided at its tip end with a fork 603 having three projections 604 made of quartz and having height of 40 mm in the vertical direction.

The wafer cassette 201 loading 25 cleaned silicon wafers 101 was disposed in the load chamber 102. The fork 109 of the wafer transfer arm 107 was inserted into a predetermined location between the loaded silicon wafers 101, and only one silicon wafer 101 was placed on the fork 109 by displacing the wafer cassette 201 downward by 3 mm. Next, the wafer transfer arm 107 was moved into the reaction chamber 103.

After the silicon wafer 101 on the fork 109 was moved directly above the susceptor 601, the fork 603 of the wafer lifing arm 602 was inserted under the silicon wafer 101 and displaced upward by 10 mm, and the fork 603 pushed up the silicon wafer 101, thereby separating the silicon wafer 101 from the fork 109 and placing the silicon wafer 101 on the projections 604 of the fork 603.

Next, after the wafer transfer arm 107 was returned into the transfer chamber 105, the wafer lifting arm 602 was displaced downward, and the silicon wafer 101 was placed on the susceptor 601. Then, the wafer lifting arm 602 was returned into the transfer chamber 105, and the transferring procedure of the silicon wafer 101 was completed.

Next, the gate valves 106 separating the reaction chamber 501 and the transfer chamber 105 from each other were closed and then, argon gas was allowed to flow from the gas supplying equipment 111 at five liters/minute and at the same time, the dry pump (not shown) of the gas discharge equipment 112 was operated to lower a pressure in the reaction chamber 103.

When the pressure reached one Torr, the heating lamps 206 illuminated, and the silicon wafer 101 on the susceptor 601 was heated to 800° C. The heating lamps 206 went out after 15 seconds from the instant when the wafer was heated to 800° C., immediately thereafter nitrogen gas was introduced into the reaction chamber 501 from the gas supplying equipment 111 and after 30 seconds, the pressure in the reaction chamber 501 was returned to the atmospheric pressure.

Next, the wafer lifting arm 602 was inserted under the silicon wafer 101 and displaced upward by 10 mm, and the fork 603 pushed up the silicon wafer 101, thereby separating the silicon wafer 101 from the susceptor 601 and placing the silicon wafer 101 on the projections 604 of the fork 603.

Then, the wafer transfer arm 107 was inserted into a gap between the susceptor 601 and the separated silicon wafer 101, the wafer lifting arm 602 was displaced downward, and the silicon wafer 101 was placed on the fork 109. The wafer lifting arm 602 was returned into the transfer chamber 105, the wafer transfer arm 107 was moved into the unload chamber 104 from the reaction chamber 501.

The silicon wafer 101 on the fork 109 was separated from the fork 109 by displacing the wafer cassette 201 upward by 3 mm, and the silicon wafer 101 was loaded into the wafer cassette 201. By returning the wafer transfer arm 107 into the transfer chamber 105, a series of heating process was completed.

(Fourth Embodiment)

Figure 8:
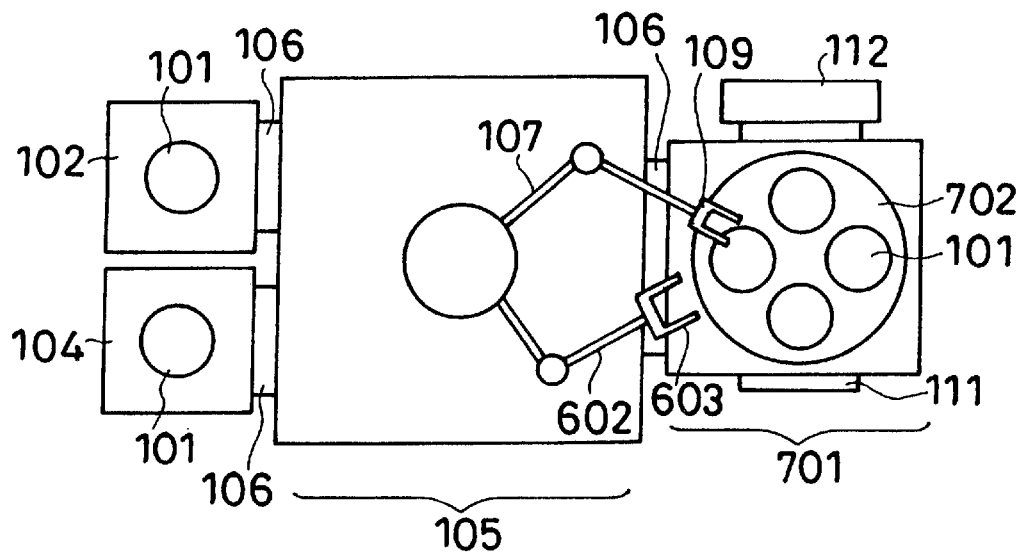
FIG. 8 is a schematic transversal sectional view for explaining a semiconductor manufacturing apparatus according to a fourth embodiment of the present invention.

FIG. 8 is a schematic transverse sectional view of an apparatus of the fourth embodiment capable of simultaneously processing four silicon wafers 101. Since the fourth embodiment is the same as the first embodiment except for the reaction chamber 701 and the fork 603 of the wafer lifting arm 602, only the reaction chamber 701 will be explained here.

A susceptor 702 capable of simultaneously mounting four silicon wafers 101 is to be placed is disposed in the reaction chamber 701. The susceptor 702 is made of quartz and provided with four circular openings 703. The wafer lifting arm 602 is provided at its tip end with a fork 603 having three projections 604 made of quartz and having height of 40 mm in the vertical direction.

Figure 9:
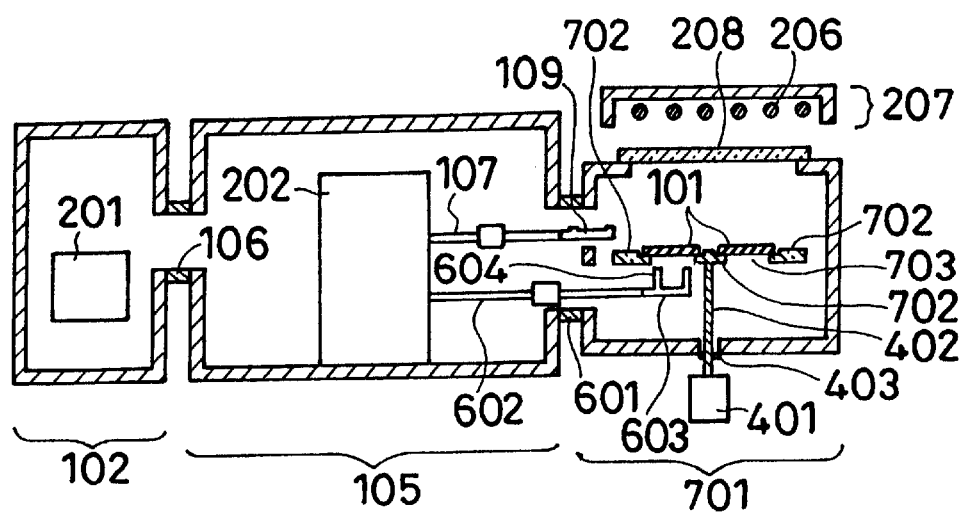
FIG. 9 is a schematic longitudinal sectional view of FIG. 8.
Figure 10:
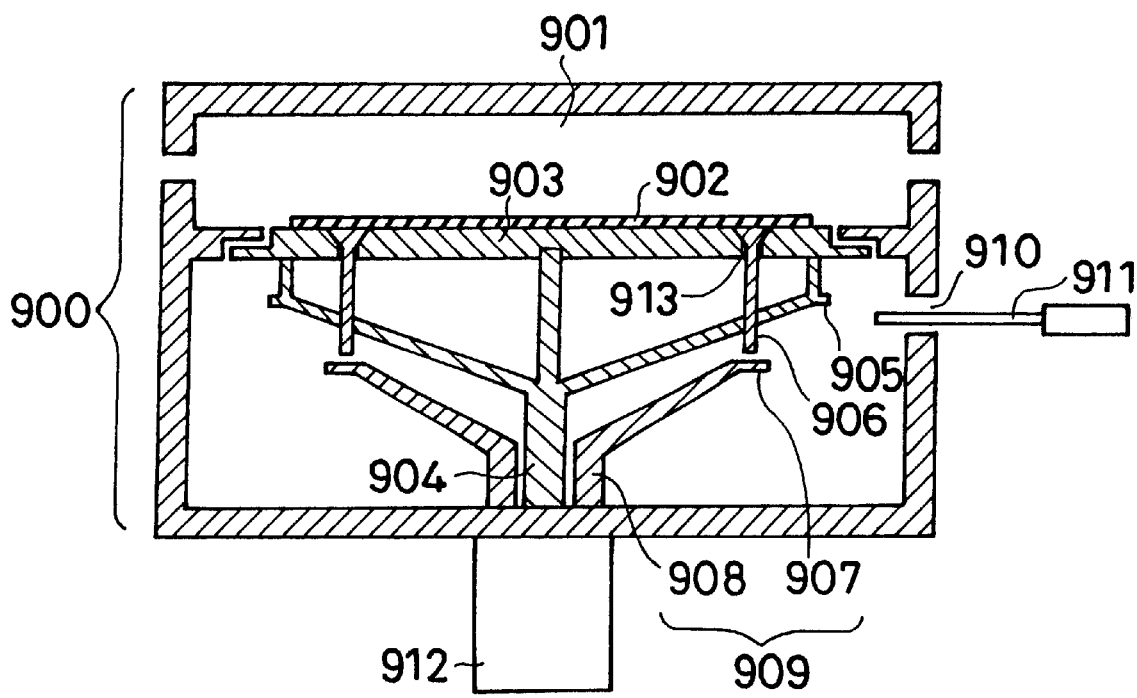
FIG. 10 is a schematic longitudinal sectional view of a conventional semiconductor manufacturing apparatus.

FIG. 9 is a vertical sectional view of FIG. 8. A rotation mechanism 401 of the susceptor 702 is provided at a lower portion of the reaction chamber 701, and the susceptor 702 can be rotated by a rotation shaft 402. A vacuum seal 403 is provided for cutting off the reaction chamber 701 from outside air.

The wafer cassette 201 loading 25 cleaned silicon wafers 101 was disposed in the load chamber 102. The fork 109 of the wafer transfer arm 107 was inserted into a predetermined location between the loaded silicon wafers 101, and only one silicon wafer 101 was placed on the fork 109 by displacing the wafer cassette 201 downward by 3 mm.

Next, the wafer transfer arm 107 was moved into the reaction chamber 701. After a silicon wafer 101 on the fork 109 was moved above one of the four openings 703 of the susceptor 702 that was closest to the transfer chamber 105, the fork 603 of the pin lifting arm 602 was inserted under the silicon wafer 101. The pin lifting arm 602 was displaced upward by 10 mm, and the fork 603 pushed up the silicon wafer 101 on the fork 109, thereby separating the silicon wafer 101 from the fork 109 and placing the silicon wafer 101 on the projections 604 of the fork 603.

Next, the wafer transfer arm 107 was returned into the transfer chamber 105 and then inserted into the load chamber 102, and a new silicon wafer 101 was taken out from the load chamber 102 in the same manner as that of the first silicon wafer 101.

While the wafer transfer arm 107 was taking out the new silicon wafer 101 from the load chamber 102, the wafer lifting arm 602 was displaced downward, and the silicon wafer 101 was placed at the opening 703 of the susceptor 702. Then, the susceptor 702 was rotated by 90 degrees by rotation means 401.

Then, a new silicon wafer 101 was moved from the transfer chamber 105 above one of the four openings 703 of the susceptor 702 that was closest to the transfer chamber 105. Then, the wafer lifting arm 602 was again displaced upward by 10 mm, thereby separating the new silicon wafer 101 from the fork 109 and placing the silicon wafer 101 on the projections 604 of the fork 603. Thereafter, the four silicon wafers 101 were sequentially placed on the susceptor 702 in the same manner.

After the fourth silicon wafers 101 were placed on the susceptor 702, the wafer transfer arm 107 and the wafer lifting arm 602 were returned into the transfer chamber 105, and the transferring procedure of the silicon wafers 101 was completed.

Next, the gate valves 106 separating the reaction chamber 701 and the transfer chamber 105 from each other were closed and then, argon gas was allowed to flow from the gas supplying equipment 111 at five liters/minute and at the same time, the dry pump (not shown) of the gas discharge equipment 112 was operated to lower a pressure in the reaction chamber 701.

When the pressure reached one Torr, the heating lamps 206 illuminated, and the silicon wafer 101 on the susceptor 702 was heated to 800° C. The heating lamps 206 went out after 15 seconds from the instant when the wafer was heated to 800° C., immediately thereafter nitrogen gas was introduced into the reaction chamber 701 from the gas supplying equipment 111 and after 30 seconds, the pressure in the reaction chamber 701 was returned to the atmospheric pressure.

Next, the wafer lifting arm 602 was moved under of the silicon wafer 101 that was closest to the transfer chamber 105 and displaced upward by 10 mm, and the fork 603 pushed up the silicon wafer 101, thereby separating the silicon wafer 101 from the susceptor 702 and placing the silicon wafer 101 on the projections 604 of the fork 603.

Then, the wafer transfer arm 107 was inserted into a gap between the susceptor 702 and the separated silicon wafer 101, the wafer lifting arm 602 was displaced downward, and the silicon wafer 101 was placed on the fork 109. The wafer transfer arm 107 was moved to the wafer cassette 201 in the unload chamber 104 from the reaction chamber 701, the silicon wafer 101 on the fork 109 was separated from the fork 109 by displacing the wafer cassette 201 upward by 3 mm, and the silicon wafer 101 was loaded into the wafer cassette 201.

While the wafer transfer arm 107 moved the processed silicon wafer 101 to the unload chamber 104, the susceptor 702 was rotated by 90 degrees by the rotation mechanism 401 and then, the wafer lifting arm 602 was displaced upward by 10 mm, the second silicon wafer 101 was separated from the susceptor 702 by the fork 603 and placed on the projections 604 of the fork 603. Then, the wafer transfer arm 107 was inserted between the susceptor 702 and the silicon wafer 101 which was pushed up by the fork 603.

Thereafter, the remaining silicon wafers 101 were moved into the unload chamber 104 in the same manner as that when the first silicon wafer 101 was taken out, and a series of heating procedure was completed.

In the above first to fourth embodiments, it is also possible to form a polycrystalline silicon thin film or an epitaxial silicon thin film on the silicon wafer 101 by supplying mono-silane gas from the gas supplying equipment 111 at the time of the thermal processing in each of the reaction chambers 103, 301, 501 and 701.

Further, by adapting the gas supplying equipment 111 such that it can supply tungsten fluoride gas, ammonia gas, dichlor-silane gas, it is possible to form a thin film other than the silicon thin film, such as a tungsten film and a silicon nitride film.

Although the lamp heating system was used for heating the silicon wafer 101 in the above embodiments, a resistance heating system or a high frequency heating system may also be used.

The present invention can suitably be applied not only for forming a thin film onto the semiconductor wafer but also for oxidizing or etching the semiconductor wafer.

It is possible to manufacture a semiconductor device from the silicon wafer 101 by forming, for example, a polycrystalline silicon thin film, an epitaxial silicon thin film, a tungsten film or a silicon nitride film on the silicon wafer 101, and by carrying out appropriate processing such as introduction of impurities before or after the former film forming process.

Furthermore, the present invention can suitably be applied not only to the semiconductor wafer but also to film forming process onto a glass substrate or the like for manufacturing liquid crystal display elements, etching process thereof and the like.

According to the present invention, in a semiconductor manufacturing apparatus used in a thermal processing procedure of a semiconductor wafer, chemical-vapor deposition (CVD) procedure used when various thin films are used, and an epitaxial growing procedure when epitaxial wafers are manufactured, both an arm for moving a wafer in the horizontal direction and an arm for displacing the wafer in the vertical direction when the wafer is received and delivered are disposed in a transfer chamber. With this structure, the present invention provides excellent effects that it is possible to eliminate vertically moving means of the wafer which is conventionally disposed at a lower portion of a reaction chamber, to extremely simplify the structure of the reaction chamber, and to suppress the contamination of the wafer due to dust from the vertically moving means.

Further, since the susceptor holding a plurality of wafers can rotate, there are effects that the plurality of wafers can sequentially be placed on the susceptor and separated from the susceptor, and throughput can be enhanced.

What is claimed is:

1. A substrate processing apparatus, comprising:
a substrate processing chamber for processing a substrate;
a transfer chamber;
a substrate mounting body for mounting said substrate, said substrate mounting body having a through hole formed in a vertical direction and being provided in said substrate processing chamber;
a substrate lifting member capable of vertically moving in said through hole;
a first arm, capable of extending from said transfer chamber into said substrate processing chamber, for transferring said substrate in a horizontal direction;
a second arm capable of extending from said transfer chamber into said substrate processing chamber, capable of moving in a vertical direction, and capable of separating said substrate upward from said substrate mounting body by moving said substrate lifting member upward; and
a driving mechanism provided in said transfer chamber for extending said first and second arms from said transfer chamber into said substrate processing chamber and for moving said first arm in the horizontal direction and moving said second arm in the vertical direction.

2. A substrate processing apparatus according to claim 1, wherein said substrate lifting member is movably attached to said substrate mounting body such that said substrate lifting member can move in said through hole in the vertical direction.

3. A substrate processing apparatus according to claim 1, wherein said substrate lifting member is mounted to said second arm.

4. A substrate processing apparatus according to claim 1, further comprising a rotation mechanism for rotating said substrate mounting body in the horizontal direction.

5. A substrate processing apparatus according to claim 1, further comprising a rotation mechanism capable of rotating said substrate mounting body by a predetermined angle in the horizontal direction, wherein said substrate mounting body can load a plurality of substrates such that said substrates are juxtaposed to each other in the horizontal direction.

6. A semiconductor manufacturing apparatus comprising said substrate processing apparatus according to claim 1, wherein said substrate is a semiconductor wafer.

7. A substrate processing apparatus, comprising:
a substrate processing chamber for processing a substrate;
a transfer chamber;
a substrate mounting body for mounting said substrate, said substrate mounting body having a through hole formed in a vertical direction and being provided in said substrate processing chamber;
a substrate lifting member capable of vertically moving in said through hole;
a first arm, capable of extending from outside said substrate processing chamber into said substrate processing chamber, for transferring said substrate in a horizontal direction;
a second arm capable of extending from outside said substrate processing chamber into said substrate processing chamber, capable of moving in a vertical direction, and capable of separating said substrate upward from said substrate mounting body by moving said substrate lifting member upward; and
a driving mechanism provided outside said substrate processing chamber for extending said first and second arms from outside said substrate processing chamber into said substrate processing chamber and for moving said first arm in the horizontal direction and moving said second arm in the vertical direction.

8. A substrate processing apparatus according to claim 7, wherein said substrate lifting member is movably attached to said substrate mounting body such that said substrate lifting member can move in said through hole in the vertical direction.

9. A substrate processing apparatus according to claim 7, wherein said substrate lifting member is mounted to said second arm.

10. A substrate processing apparatus according to claim 7, further comprising a rotation mechanism for rotating said substrate mounting body in the horizontal direction.

11. A substrate processing apparatus according to claim 7, further comprising a rotation mechanism capable of rotating said substrate mounting body by a predetermined angle in the horizontal direction, wherein said substrate mounting body can load a plurality of substrates such that said substrates are juxtaposed to each other in the horizontal direction.

12. A semiconductor manufacturing apparatus comprising said substrate processing apparatus according to claim 7, wherein said substrate is a semiconductor wafer.

13. A substrate processing method using a substrate processing apparatus, comprising:
    a substrate processing chamber for processing a substrate;
    a transfer chamber;
    a substrate mounting body for mounting said substrate, said substrate mounting body having a through hole formed in a vertical direction and being provided in said substrate processing chamber;
    a substrate lifting member capable of vertically moving in said through hole;
    a first arm, capable of extending from said transfer chamber into said substrate processing chamber, for transferring said substrate in a horizontal direction;
    a second arm capable of extending from said transfer chamber into said substrate processing chamber, capable of moving in a vertical direction, and capable of separating said substrate upward from said substrate mounting body by moving said substrate lifting member upward; and
    a driving mechanism provided in said transfer chamber for extending said first and second arms from said transfer chamber into said substrate processing chamber and for moving said first arm in the horizontal direction and moving said second arm in the vertical direction, comprising the steps of:
        loading said substrate onto said first arm and positioning said substrate above said substrate mounting body in said substrate processing chamber;
        thereafter moving said substrate lifting member upward by moving said second arm upward, thereby moving said substrate from said first arm onto said substrate lifting member;
        thereafter removing said first arm from below said substrate;
        thereafter moving said substrate lifting member downward by moving said second arm downward, thereby moving said substrate from said substrate lifting member onto said substrate mounting body; and
        thereafter processing said substrate in said substrate processing chamber.

14. A substrate processing method according to claim 13, further comprising the steps of:
    moving said substrate lifting member upward by moving said second arm upward after said substrate is processed, thereby moving said substrate from said substrate mounting body onto said substrate lifting member;
    thereafter positioning said first arm between said substrate and said substrate mounting body; and
    thereafter moving said substrate lifting member downward by moving said second arm downward, thereby moving said substrate from said substrate lifting member onto said first arm.

15. A manufacturing method for a semiconductor device using an apparatus, comprising:
    a semiconductor wafer processing chamber for processing a semiconductor wafer;
    a transfer chamber;
    a semiconductor wafer mounting body for mounting said semiconductor wafer, said semiconductor wafer mounting body having a through hole formed in a vertical direction and being provided in said semiconductor wafer processing chamber;
    a semiconductor wafer lifting member capable of vertically moving in said through hole;
    a first arm, capable of extending from said transfer chamber into said semiconductor wafer processing chamber, for transferring said semiconductor wafer in a horizontal direction;
    a second arm capable of extending from said transfer chamber into said semiconductor wafer processing chamber, capable of moving in a vertical direction, and capable of separating said semiconductor wafer upward from said semiconductor wafer mounting body by moving said semiconductor wafer lifting member upward; and
    a driving mechanism provided in said transfer chamber for extending said first and second arms from said transfer chamber into said semiconductor wafer processing chamber and for moving said first arm in the horizontal direction and moving said second arm in the vertical direction, comprising the steps of:
        loading said semiconductor wafer onto said first arm and positioning said semiconductor wafer above said semiconductor wafer mounting body in said semiconductor wafer processing chamber;
        thereafter moving said semiconductor wafer lifting member upward by moving said second arm upward, thereby moving said semiconductor wafer from said first arm onto said semiconductor wafer lifting member;
        thereafter removing said first arm from below said semiconductor wafer;
        thereafter moving said semiconductor wafer lifting member downward by moving said second arm downward, thereby moving said semiconductor wafer from said semiconductor wafer lifting member onto said semiconductor wafer mounting body; and
        thereafter processing said semiconductor wafer in said semiconductor wafer processing chamber.

16. A manufacturing method for a semiconductor device according to claim 15, further comprising the steps of:
    moving said semiconductor wafer lifting member upward by moving said second arm upward after said semiconductor wafer is processed, thereby moving said semiconductor wafer from said semiconductor wafer mounting body onto said semiconductor wafer lifting member;

thereafter positioning said first arm between said semiconductor wafer and said semiconductor wafer mounting body; and thereafter moving said semiconductor wafer lifting member downward by moving said second arm downward, thereby moving said semiconductor wafer from said semiconductor wafer lifting member onto said first arm.

* * * * *